(12) United States Patent
Shih et al.

(10) Patent No.: US 9,536,611 B2
(45) Date of Patent: Jan. 3, 2017

(54) 3D NAND MEMORY USING TWO SEPARATE SSL STRUCTURES IN AN INTERLACED CONFIGURATION FOR ONE BIT LINE

(71) Applicant: Macronix International Co., Ltd., Hsinchu (TW)

(72) Inventors: Yen-Hao Shih, Elmsford, NY (US); Yi-Hsuan Hsiao, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 233 days.

(21) Appl. No.: 13/887,019

(22) Filed: May 3, 2013

(65) Prior Publication Data
US 2014/0269077 A1   Sep. 18, 2014

Related U.S. Application Data

(60) Provisional application No. 61/778,539, filed on Mar. 13, 2013.

(51) Int. Cl.
*G11C 16/10* (2006.01)
*H01L 27/115* (2006.01)

(52) U.S. Cl.
CPC ............ *G11C 16/10* (2013.01); *H01L 27/1157* (2013.01); *H01L 27/11524* (2013.01); *H01L 27/11556* (2013.01); *H01L 27/11582* (2013.01)

(58) Field of Classification Search
CPC .................................................. G11C 16/10
USPC .................................................. 365/185.17
See application file for complete search history.

(56) References Cited

U.S. PATENT DOCUMENTS

| | | | |
|---|---|---|---|
| 9,147,468 B1* | 9/2015 | Lue ..................... | G11C 11/5671 |
| 2011/0140070 A1* | 6/2011 | Kim ......................... | G11C 5/02 257/5 |
| 2011/0266604 A1* | 11/2011 | Kim ................... | H01L 27/11578 257/314 |

(Continued)

OTHER PUBLICATIONS

"Memory Architecture of 3D Vertical Gate (3DVG) NAND Flash Using Plural Island-Gate SSL Decoding Method and Study of It's Program Inhibit Characteristics", Kuo-Pin Chang et. al, www.researchgate.net publications, Jan. 2012 (relied upon 2012 4th IEEE IMW publication).*

(Continued)

*Primary Examiner* — Anthan Tran
*Assistant Examiner* — Mushfique Siddique
(74) *Attorney, Agent, or Firm* — Yiding Wu; Haynes Beffel & Wolfeld LLP (57) ABSTRACT

A semiconductor device includes a plurality of active strips, where active strips in the plurality are coupled together at one end by a pad and terminated at another end by a conductive line. The device includes memory cells at crosspoints between the plurality of active strips and a plurality of word lines. The device includes string select structures arranged in an interlaced configuration as side gates for active strips. The device includes control circuitry, configured to turn on a particular active strip by applying a turn-on voltage to two string select structures arranged as side gates for the particular active strip, and to turn off a second particular active strip by applying a turn-off bias to at least one string select structure arranged as a side gate for the second particular active strip. The turn-off bias includes one of a ground voltage, a non-negative voltage, and a floating condition.

23 Claims, 10 Drawing Sheets

(56) References Cited

U.S. PATENT DOCUMENTS

| | | | |
|---|---|---|---|
| 2012/0068241 A1* | 3/2012 | Sakuma | H01L 27/11519 257/314 |
| 2012/0182806 A1* | 7/2012 | Chen | H01L 27/11573 365/185.17 |
| 2014/0269077 A1 | 9/2014 | Shih et al. | |

OTHER PUBLICATIONS

Chen, Chih-Ping, et al., "A Highly Pitch Scalable 3D Vertical Gate (VG) NAND Flash Decoded by a Novel Self-Aligned Independently Controlled Double Gate (IDG) String Select Transistor (SSL)", Jun. 12-14, 2012, 2012 Symposium on VLSI Technology (VLSIT), pp. 91-92.

* cited by examiner

|  | Select BL2<br>Unselect Other BLs |
|---|---|
| SSL1 | 0V |
| SSL2 | 3.3V |
| SSL3 | 0V |
| SSL4 | 0V |
| SSL5 | 0V |
| SSL6 | 0V |

| | Select BL2 Unselect Other BLs |
|---|---|
| SSL1 | -7V |
| SSL2 | 3.3V |
| SSL3 | 3.3V |
| SSL4 | -7V |
| SSL5 | 0V |
| SSL6 | 0V |
| SSL7 | 0V |

|        | Select BL2 Unselect Other BLs |
|--------|-------------------------------|
| SSL1   | 0V                            |
| SSL2   | 3.3V                          |
| SSL3   | 3.3V                          |
| SSL4   | 0V                            |
| SSL5   | 0V                            |
| SSL6   | 0V                            |
| SSL7   | 0V                            |

FIG. 10

3D NAND MEMORY USING TWO SEPARATE SSL STRUCTURES IN AN INTERLACED CONFIGURATION FOR ONE BIT LINE

RELATED APPLICATIONS

This application claims benefit of U.S. Provisional Patent Application No. 61/778,539 filed on 13 Mar. 2013, which application is incorporated by reference as if fully set forth herein.

BACKGROUND OF THE INVENTION

Field of the Invention

The present invention relates to high density memory devices, and particularly to memory devices in which multiple planes of memory cells are arranged to provide a three-dimensional 3D array.

Description of Related Art

High density memory devices are being designed that comprise arrays of flash memory cells, or other types of memory cells. In some examples, the memory cells comprise thin film transistors which can be arranged in 3D architectures.

In one example, a 3D memory device includes a plurality of stacks of NAND strings of memory cells. The stacks include active strips separated by insulating material. The 3D memory device includes an array including a plurality of word lines structures, a plurality of string select structures, and ground select lines, arranged orthogonally over the plurality of stacks. Memory cells including charge storage structures are formed at cross-points between side surfaces of the active strips in the plurality of stacks and the word lines structures. Array arrangement for array elements including string select structures can affect array efficiency, and/or on/off characteristics for the stacks of NAND strings of 3D memory devices.

One 3D memory device uses finger VG (vertical gates), and has relatively low array efficiency because it uses two sets of SSL gate structures, two horizontal ground select lines, and two sets of ground contacts. Another 3D memory device uses IDG (independent double gates), and has higher array efficiency because it uses one set of SSL gate structures instead of two, one horizontal ground select line instead of two, and one ground line instead of two sets of ground contacts. But the second 3D memory device exhibits relatively poor current on/off characteristics.

It is desirable to provide a structure for three-dimensional integrated circuit memory with higher array efficiency, and improved on/off characteristics for the stacks of NAND strings.

SUMMARY

A semiconductor device includes a plurality of active strips, where active strips in the plurality of active strips are coupled together at one end by a pad and terminated at another end by a conductive line. The device includes a plurality of word lines, and memory cells at cross-points between the plurality of active strips and the plurality of word lines. The device includes a plurality of string select structures arranged in an interlaced configuration with the active strips.

The string select structures are configured to act as side gates for channels in the active strips, thereby forming string select switches. The plurality of string select structures is disposed between the pad and the plurality of memory cells. The plurality of string select structures include a first subset positioned within a first range of distance from the pad and a second subset positioned within a second range of distance from the pad, the first range being different than the second range. In one embodiment, the first range and the second range have no overlap. In an alternative embodiment, the first range and the second range have a partial overlap. The string select structures have thickness between the active strips sufficient that at least some of the string select structures are configured as the side gates for two adjacent strips in the plurality of active strips.

Active strips in the plurality of active strips are coupled on a first side to a string select structure in one of the first subset and the second subset, and are coupled on a second side opposite the first side to a string select structure in another of the first subset and the second subset.

The device includes an insulator that fills between the active strips in the plurality of active strips configured so that the insulator is disposed in the first range of distance from the pad adjacent the second side of the active strips opposite the string select structures coupled to the first side, and disposed in the second range of distance from the pad adjacent the first side of the active strips opposite the string select structures coupled to the second side.

The plurality of string select structures selects a particular active strip in the plurality of active strips. A combined selection of a particular bit line in a plurality of bit lines, the particular active strip, and a particular word line in the plurality of word lines, identifies a particular memory cell of the memory cells. A particular string select structure in the plurality of string select structures controls conductivity in a first active strip and a second active strip in the plurality of active strips.

The device further includes control circuitry coupled to the plurality of string select structures. In order to select a particular active strip in the plurality of active strips, the control circuitry applies a turn-on voltage to a first string select structure in the first subset configured as a side gate for the particular active strip, and to a second string select structure in the second subset configured as a side gate for the particular active strip.

In order to unselect a first adjacent strip and a second adjacent strip adjacent to the particular active strip, where the first adjacent strip is coupled to the second string select structure in the second subset, and the second adjacent strip is coupled to the first string select structure in the first subset, the control circuitry applies a turn-off bias to a third string select structure in the first subset configured as a side gate for the first adjacent strip, and to a fourth string select structure in the second subset configured as a side gate for the second adjacent strip. The turn-off bias includes one of a ground voltage, a non-negative voltage, and a floating condition applied to the third and fourth string select structures.

The plurality of active strips and the pad are disposed in a layer of a multilayer structure including a plurality of layers that comprise respective pluralities of active strips and pads, and wherein string select structures in the plurality of string select structures are extended through the plurality of layers between the corresponding pluralities of active strips, and are disposed as side gates for active strips in the plurality of layers.

Other aspects and advantages of the present invention can be seen on review of the drawings, the detailed description and the claims, which follow.

DETAILED DESCRIPTION

A detailed description of embodiments is provided with reference to the Figures.

Figure 1:
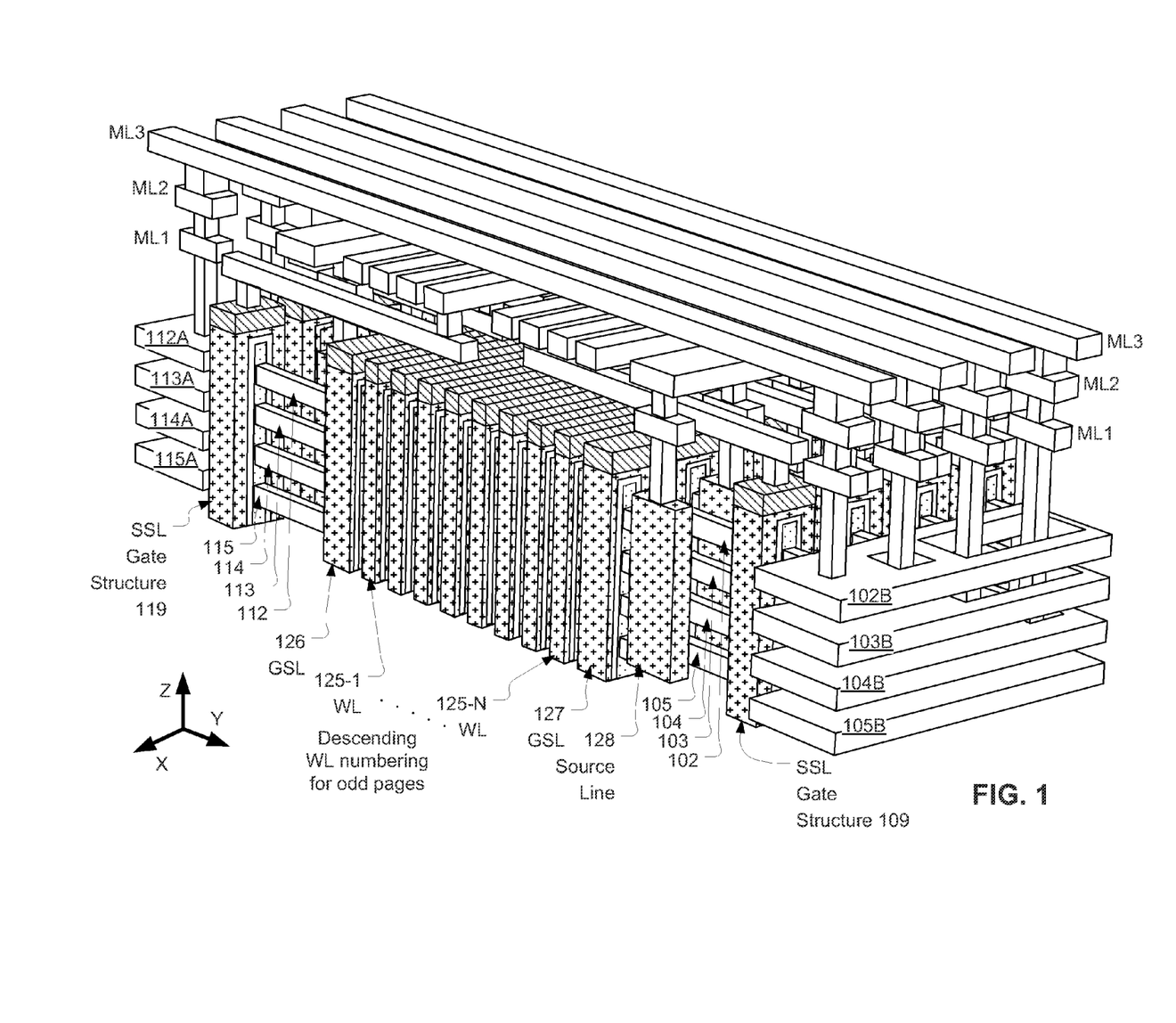
FIG. 1 is a perspective illustration of a 3D NAND memory array structure.

FIG. 1 is a perspective illustration of a 3D NAND memory array structure. Insulating material is removed from the drawing to expose additional structure for illustrative purposes. For example, insulating layers are removed between the active strips (e.g. 112-115) in stacks, and are removed between the stacks of active strips.

The multilayer array is formed on an insulating layer, and includes a plurality of word lines 125-1 WL, . . . , 125-N WL conformal with the plurality of stacks. The plurality of stacks includes active strips 112, 113, 114, 115. Active strips in the same plane are electrically coupled together by a pad arranged to have a landing area for contact to an interlayer conductor. The pads for a plurality of layers can be arranged in stairstep structures as shown in FIG. 1, with the landing area on each successive pad disposed on a step of the structure. Landing areas for connection of the pads and the interlayer conductors to the landing areas on the pads can be arranged in patterns other than a simple stairstep, if desired or needed for a particular manufacturing setting.

The shown word line numbering, ascending from 1 to N going from the back to the front of the overall structure, applies to even memory pages. For odd memory pages, the word line numbering descends from N to 1 going from the back to the front of the overall structure.

Pads 112A, 113A, 114A, 115A terminate alternate active strips, such as active strips 112, 113, 114, 115 in each layer. As illustrated, these pads 112A, 113A, 114A, 115A are electrically connected to different bit lines for connection to decoding circuitry to select planes within the array. These pads 112A, 113A, 114A, 115A can be patterned, with possible the exception of vias to the landing areas at the same time that the plurality of stacks are defined.

Pads 102B, 103B, 104B, 105B terminate the other alternate active strips, such as active strips 102, 103, 104, 105 in each layer. As illustrated, these pads 102B, 103B, 104B, 105B are electrically connected to different bit lines for connection to decoding circuitry to select planes within the array. These pads 102B, 103B, 104B, 105B can be patterned, with possible the exception of vias to the landing areas, at the same time that the plurality of stacks are defined.

Any given stack of active strips is coupled to either the pads 112A, 113A, 114A, 115A, or the pads 102B, 103B, 104B, 105B, but not both in the illustrated example. A stack of active strips has one of the two opposite orientations of bit line end-to-source line end orientation, or source line end-to-bit line end orientation. For example, the stack of active strips 112, 113, 114, 115 has bit line end-to-source line end orientation; and the stack of active strips 102, 103, 104, 105 has source line end-to-bit line end orientation.

The stack of active strips 112, 113, 114, 115 is terminated at one end by the pads 112A, 113A, 114A, 115A, passes through SSL gate structure 119, ground select line GSL 126, word lines 125-1 WL through 125-N WL, ground select line GSL 127, and terminated at the other end by source line 128. The stack of active strips 112, 113, 114, 115 does not reach the pads 102B, 103B, 104B, 105B.

The stack of active strips 102, 103, 104, 105 is terminated at one end by the pads 102B, 103B, 104B, 105B, passes through SSL gate structure 109, ground select line GSL 127, word lines 125-N WL through 125-1 WL, ground select line GSL 126, and terminated at the other end by a source line (obscured by other parts of figure). The stack of active strips 102, 103, 104, 105 does not reach the pads 112A, 113A, 114A, 115A.

A layer of memory material separates the word lines 125-1 WL through 125-N WL, from the active strips 112-115 and 102-105. Ground select lines GSL 126 and GSL 127 are conformal with the plurality of active strips, similar to the word lines.

Every stack of active strips is terminated at one end by pads, and at the other end by a source line. For example, the stack of active strips 112, 113, 114, 115 is terminated at one end by pads 112A, 113A, 114A, 115A, and terminated on the other end by source line 128. At the near end of the figure, every other stack of active strips is terminated by the pads 102B, 103B, 104B, 105B; and every other stack of active strips is terminated by a separate source line. At the far end of the figure, every other stack of active strips is terminated by the pads 112A, 113A, 114A, 115A, and every other stack of active strips is terminated by a separate source line.

Bit lines and string select lines are formed at the metals layers ML1, ML2, and ML3. Transistors are formed at cross points between the active strips (e.g. 112-115) and the word line 125-1 WL through 125-N WL. In the transistors, the active strip (e.g. 113) acts as the channel region of the device. The active strips (e.g. 112-115) can act as the gate dielectric for the transistors.

String select structures (e.g. 119, 109) are patterned during the same step that the word lines 125-1 WL through 125-n WL are defined. Transistors are formed at cross points between the active strips (e.g. 112-115) and the string select structures (e.g. 119, 109). These transistors act as string select switches coupled to decoding circuitry for selecting particular stacks in the array.

Figure 2:
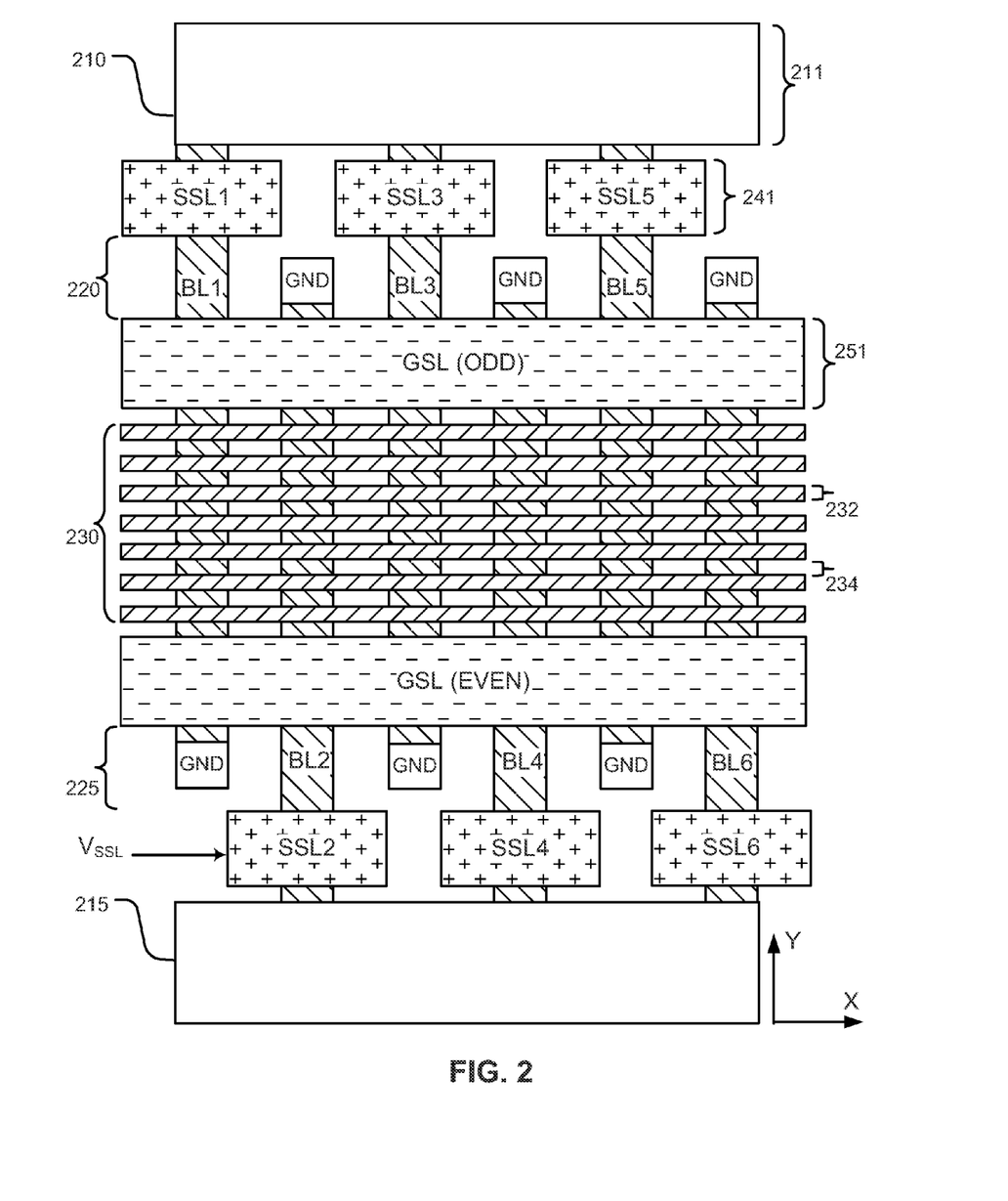
FIG. 2 is a layout view of a first array arrangement for a 3D NAND memory device.

FIG. 2 is a layout view of a first array arrangement for a finger VG (vertical gate) 3D NAND memory device. For reference, the "X" axis lies in the horizontal direction parallel to the word lines (e.g. 125-1 WL through 125-N WL in FIG. 1 or 230 in FIG. 2) in the structure, the "Y" axis lies in the horizontal direction parallel to the active strips (e.g. 112-115 in FIG. 1 or BL1-BL6 in FIG. 2) in the structure, and the "Z" axis lies in the vertical direction orthogonal to the word lines and to the active strips in the structure.

In the layout view of FIG. 2, the array arrangement includes a plurality of active strips. The memory cells are disposed at cross-points of active strips (e.g. BL1-BL6) and word lines (e.g. 230). Adjacent active strips alternate between opposite orientations, of bit line end-to-source line end orientation, and source line end-to-bit line end orientation. In one orientation of the active strips, every other active strip runs from the pad at the top (e.g. 210) to the source line at the bottom. In the opposite orientation of the active strips, every other active strip runs from the source line at the top to the pad at the bottom (e.g. 215).

Overlying the active strips (e.g. BL1-BL6), are the horizontal word lines (e.g. 230) and the horizontal ground select lines GSL (even) and GSL (odd). Also overlying the active strips, are the string select lines SSL gate structures. In one orientation of the active strips, the string select structures (e.g. SSL1, SSL3, SSL5) overlie every other active strip at the top end of the active strips (e.g. BL1, BL3, BL5). In the opposite orientation of the active strips, the string select structures (e.g. SSL2, SSL4, SSL6) overlie every other active strip at the bottom end of the active strips (e.g. BL2, BL4, BL6). In either case, the string select structures control electrical connection between any active strip and the active strip's corresponding pad (e.g. 210, 215).

The pads (e.g. 210, 215) can have a length (e.g. 211) of about 0.5 micrometer (μm). The string select structures (e.g. SSL1-SSL6) can each have a length (e.g. 241) of about 0.25 μm. The horizontal ground select lines GSL (odd) and GSL (even) can each have a length (e.g. 251) of about 0.25 μm. A space 220 between the string select structures (e.g. SSL1, SSL3, SSL5) at the top end of the active strips (e.g. BL1, BL3, BL5) and the horizontal ground select line GSL (odd) allows the source end of the active strips (e.g. BL2, BL4, BL6) to be connected to ground contacts GND. The space 220 can be about 0.4 μm. A space 225 between the string select structures (e.g. SSL2, SSL4, SSL6) at the bottom end of the active strips (e.g. BL2, BL4, BL6) and the horizontal ground select line GSL (even) allows the source end of the active strips (e.g. BL1, BL3, BL5) to be connected to ground contacts GND. The space 225 can be about 0.4 μm.

The horizontal word lines (e.g. 230) are interleaved with insulation material (not shown). Each horizontal word line can have a word line thickness (e.g. 232) of about 33 nanometers (nm) or smaller. Insulation material between two word lines can have an insulation thickness (e.g. 234) of about 33 nm or smaller. There can be 66 word lines disposed between the horizontal ground select lines GSL (odd) and GSL (even). The word lines can be manufactured with SADP (self-aligned double patterning).

Array efficiency for the 3D NAND memory device illustrated in FIG. 2 is relatively low, because the memory device uses one set of string select structures (e.g. SSL1, SSL3, SSL5) for the active strips in one orientation, and uses another set of string select structures (e.g. SSL2, SSL4, SSL6) for the active strips in the opposite orientation. The memory device also uses the horizontal ground select line GSL (even) for the active strips in one orientation, and uses the horizontal ground select line GSL (odd) for the active strips in the opposite orientation. Furthermore, the memory device uses one set of ground contacts at the source end of the active strips in one orientation (e.g. BL1, BL3, BL5), and uses another set of ground contacts at the source end of the active strips in the opposite orientation (e.g. BL2, BL4, BL6). The two sets of SSL gate structures, two horizontal ground select lines, and two sets of ground contacts reduce the array efficiency. For instance, the array efficiency for the 3D NAND memory device illustrated in FIG. 2 can be 65.4%, where the array efficiency is the ratio of space used for memory cells versus space used for overhead including SSL/GSL gate and the pads.

The 3D NAND memory device includes a plurality of planes of memory cells. A plurality of bit lines selects a particular plane in the plurality of planes of memory cells via pads (e.g. 210, 215 in FIG. 2). The particular plane is decoded by a plurality of string select structures, horizontal ground select lines GSL (ODD) and GSL (EVEN), and word lines. To select a particular stack (e.g. BL2) in each plane, a positive SSL voltage ($V_{SSL}$) is applied to the string select structure (e.g. SSL2) coupled to gates at opposite sides of the particular stack. To unselect other stacks (e.g. BL1, BL3-6), a voltage of 0V is applied to the string select structures (e.g. SSL1, SSL3-6) coupled to gates at opposite sides of the other stacks.

Figure 3:
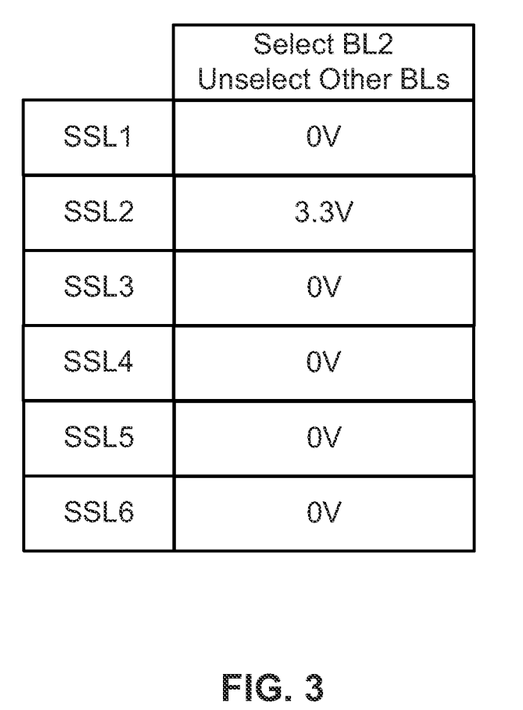
FIG. 3 is a table illustrating voltages on string select structures shown in the first array arrangement for selecting a particular stack of NAND strings of memory cells.

FIG. 3 is a table illustrating voltages on string select structures shown in the first array arrangement for selecting a particular stack in the plurality of stacks of NAND strings of memory cells. In the example shown in FIG. 3, a value for the positive SSL voltage ($V_{SSL}$) is 3.3V. To unselect other stacks (e.g. BL1, BL3-6), a voltage of about 0 volt is applied to the string select structures (e.g. SSL1, SSL3-6) coupled to the other stacks.

Figure 4:
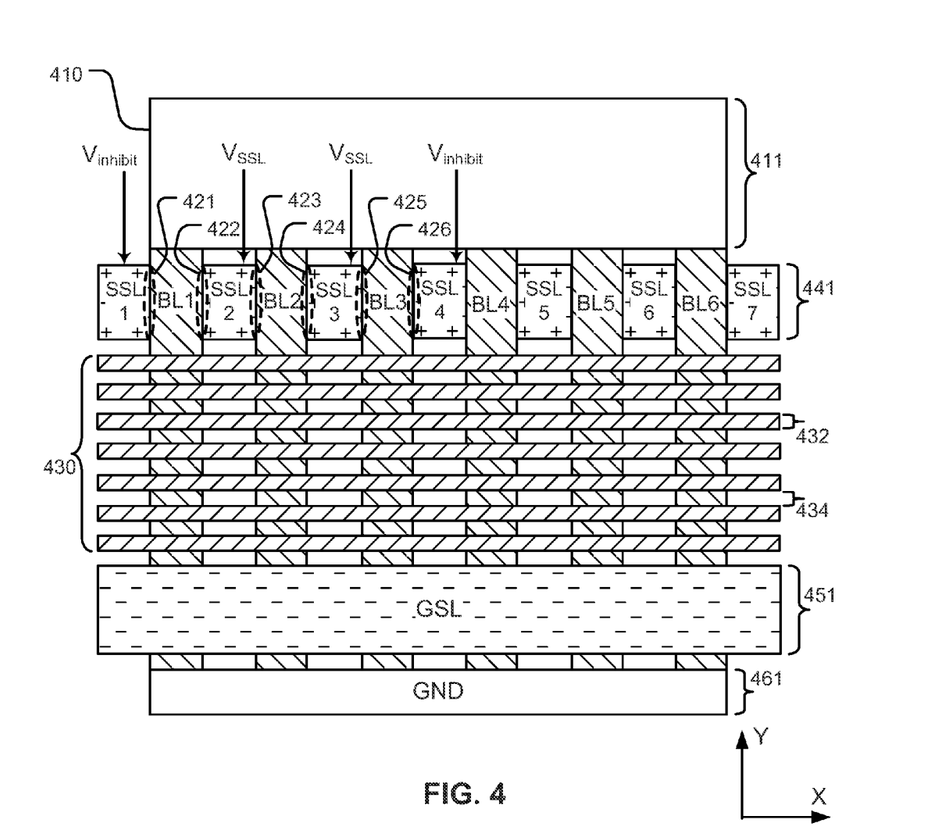
FIG. 4 is a layout view of a second array arrangement for a 3D NAND memory device.

FIG. 4 is a layout view of a second array arrangement for an IDG VG (independent double gate, vertical gate) 3D NAND memory device. For reference, the "X" axis lies in the horizontal direction parallel to the word lines (e.g. 125-1 WL through 125-N WL in FIG. 1 or 430 in FIG. 4) in the structure, the "Y" axis lies in the horizontal direction parallel to the active strips (e.g. 112-115 in FIG. 1 or BL1-BL6 in FIG. 4) in the structure, and the "Z" axis lies in the vertical direction orthogonal to the word lines and to the active strips in the structure.

In the layout view of FIG. 4, the array arrangement includes a plurality of active strips. Memory cells are disposed at cross-points of active strips (e.g. BL1-BL6) and word lines (e.g. 430). In contrast to the active strips running in opposite orientations illustrated in FIG. 2, the active strips (e.g. BL1-BL6) in FIG. 4 run in one orientation, from the pad at the top (e.g. 410) to the source line connected to a common ground line GND at the bottom.

Overlying the active strips (e.g. BL1-BL6), are the horizontal word lines (e.g. 430) and the horizontal ground select line GSL. Also overlying the active strips, are the string select structures (e.g. SSL1-SSL7). The string select structures (e.g. SSL1-SSL7) overlie the active strips at the top end of the active strips (e.g. BL1-BL6). The string select structures control electrical connection between any active strip and the active strip's corresponding pad (e.g. 410).

The pads (e.g. 410) can have a length (e.g. 411) of about 0.5 micrometer (μm). The string select structures (e.g. SSL1-SSL6) can each have a length (e.g. 441) of about 0.25 μm. The horizontal ground select line GSL can have a length (e.g. 451) of about 0.25 μm. The common ground line GND at the bottom can have a size (e.g. 461) of about 0.2 μm.

The horizontal word lines (e.g. 230) are interleaved with insulation material (not shown). Each horizontal word line can have a word line thickness (e.g. 232) of about 33 nanometers (nm). Insulation material between two word lines can have an insulation thickness (e.g. 234) of about 33 nm. There can be 66 word lines disposed between the horizontal ground select line GSL and the string select structures (e.g. SSL1-SSL7).

Array efficiency for the 3D NAND memory device illustrated in FIG. 4 is relatively high compared to the array efficiency for the 3D NAND memory device illustrated in FIG. 2, because the memory device illustrated in FIG. 4 uses one set of string select structures for the active strips instead of two sets of string select structures as shown in FIG. 2. The memory device illustrated in FIG. 4 also uses one horizontal ground select line GSL instead of the horizontal ground select line GSL (even) and GSL (odd). Furthermore, the memory device illustrated in FIG. 4 uses one common ground line for the active strips, instead of one set of ground contacts at the source end of the active strips in one orientation and another set of ground contacts at the source end of the active strips in the opposite orientation as shown in FIG. 2. Consequently, the memory device illustrated in FIG. 4 improves the array efficiency. For instance, the array efficiency for the 3D NAND memory device illustrated in FIG. 4 can be 83.7%. The 3D NAND memory device includes a plurality of planes of memory cells. A plurality of bit lines selects a particular plane in the plurality of planes of memory cells via pads 410, arranged for example in a stairstep structure. The particular plane is decoded by string select structures, a horizontal ground select line GSL, and word lines. To select a particular active strip (e.g. BL2) in each plane, a positive SSL voltage (VSSL) is applied to the string select structures (e.g. SSL2 and SSL3) coupled to gates at opposite sides (e.g. 423, 424) of the particular active strip (e.g. BL2). However, the positive SSL voltage (VSSL) is also applied to gates at first sides (e.g. 422, 425) of adjacent active strips (e.g. BL1, BL3). To unselect active strips in general, a turn-off voltage (Vinhibit) is required on corresponding string select structures. To unselect adjacent active strips (e.g. BL1, BL3) adjacent to a selected active strip (e.g. BL2), a negative turn-off voltage (Vinhibit) is required on corresponding adjacent string select structures (e.g. SSL1 and SSL4) coupled to gates at opposite sides (e.g. 421, 426) of the adjacent active strips (e.g. BL1, BL3), in order to counter-balance the effects of the positive SSL voltage (VSSL) on string select structures (e.g. SSL2 and SSL3) on gates at the first sides of adjacent active strips (e.g. BL1, BL3).

Figure 5A:
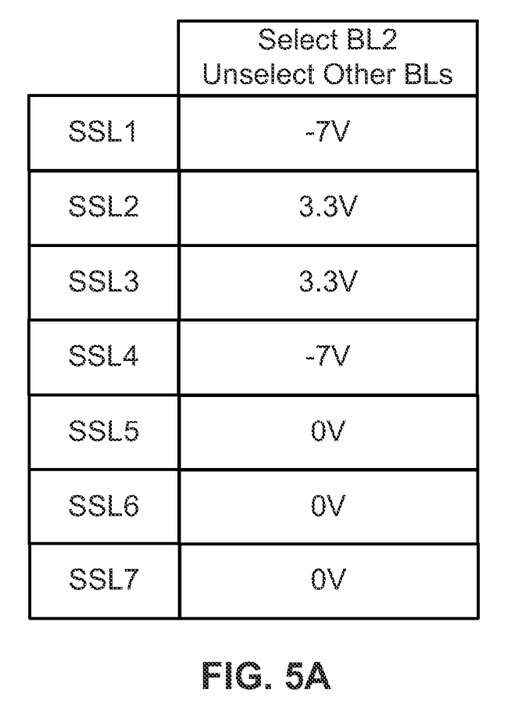
FIG. 5A is a table illustrating voltages on string select structures shown in the second array arrangement for selecting a particular stack of NAND strings of memory cells.

FIG. 5A is a table illustrating voltages on string select structures shown in the second array arrangement (IDG) for selecting a particular active strip in the plurality of active strips. In the example shown in FIG. 5A, a value for the positive SSL voltage (VSSL) on opposite sides of a selected active strip (e.g. BL2) is 3.3V, and a value for the turn-off voltage (Vinhibit) on unselected active strips (e.g. BL1, BL3) adjacent to the selected active strip (e.g. BL2) is −7V. To unselect active strips not adjacent to the selected active strip (e.g. BL4-6), a voltage of about 0 volt is applied to the string select structures (e.g. SSL5-7) coupled to the unselected active strips (e.g. BL4, BL5, BL6) not adjacent to the selected active strip (e.g. BL2).

Thus, the technology described herein includes a semiconductor device, comprising an array of memory cells including a plurality of stacks of strings of memory cells and a plurality of bit lines, the strings in the plurality of stacks being coupled to the plurality of bit lines via pads disposed at a first end of the strings in the plurality of stacks, with a plurality of string select structures being disposed between the pads and the first end of the strings in of the plurality of stacks and arranged interlacedly. An interlaced configuration includes a layout wherein two string select structures in the plurality of string select structures are disposed along each of the stacks in the plurality of stacks, the two string select structures on each stack being offset along the stacks so as to form the interlaced arrangement.

Also, the technology described herein includes a semiconductor device, comprising control circuitry coupled to a plurality of string select structures, wherein the control circuitry applies non-zero, on-state voltages to two of the plurality of string select structures, both of which are adjacent a selected string, and applies off-state voltages to remaining string select structures in the plurality to block current flow in other strings. A method of manufacturing a semiconductor device includes providing control circuitry coupled to a plurality of string select structures, wherein the control circuitry applies non-zero, on-state voltages to two of the plurality of string select structures, both of which are adjacent a selected string, and applies off-state voltages to remaining string select structures in the plurality to block current flow in other strings. A method of operating a semiconductor device includes applying non-zero, on-state voltages to two of the plurality of string select structures, both of which are adjacent a selected string, and applies off-state voltages to remaining string select structures in the plurality to block current flow in other strings.

Figure 5B:
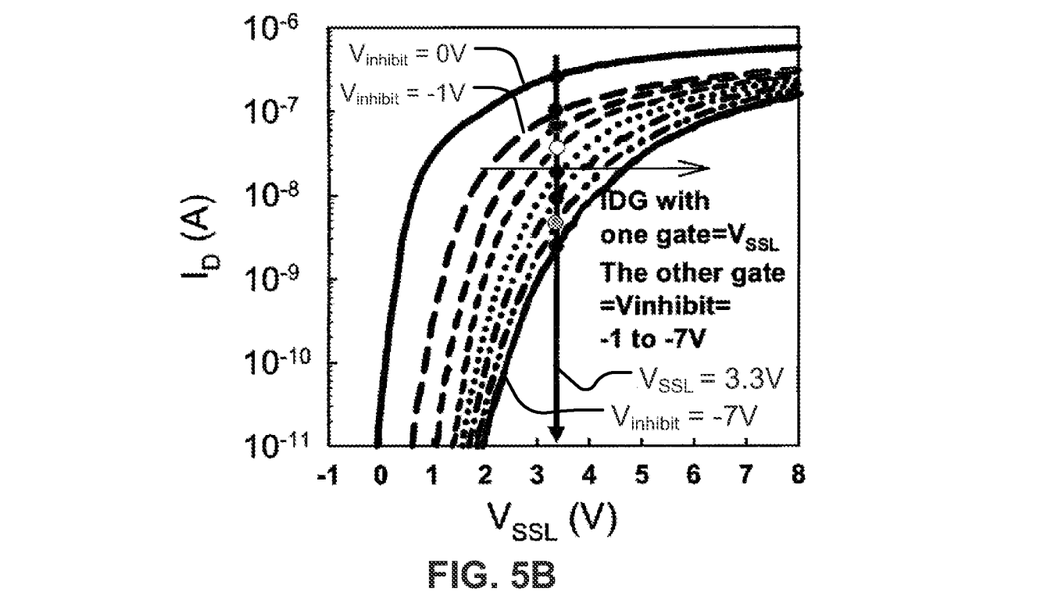
FIG. 5B illustrates current-voltage characteristics for string select structures shown in the second array arrangement.

FIG. 5B illustrates current-voltage characteristics for the string select structures as shown in FIG. 4. From top to bottom, eight current-voltage curves correspond to the turn-off voltage $V_{inhibit}$=0V, −1V, . . . , −7V. As illustrated in FIG. 4, a positive SSL voltage ($V_{SSL}$) is applied to a gate at a first side (e.g. 422) of an unselected adjacent active strip (e.g. BL1), and a turn-off voltage ($V_{inhibit}$) is applied to a gate at an opposite side (e.g. 421) of the unselected adjacent active strip (e.g. BL1). As illustrated in FIG. 5B, with the positive SSL voltage (e.g. $V_{SSL}$=3.3V in FIG. 5A) on the first side (e.g. 422, FIG. 4) and the turn-off voltage (Vinhibit) in a range between −1V and −7V on the opposite side (e.g. 421, FIG. 4) of the unselected adjacent active strip (e.g. BL1, FIG. 4), the drain current for the unselected adjacent active strip in an OFF state can be between about 3×10-9 ampere at Vinhibit=−7V and about 10-7 ampere at Vinhibit=−1V. At VSSL=3.3V, the drain current for a selected active strip in an ON state (e.g. BL2, FIG. 4) can be between 10-7 ampere and 10-6 ampere. Thus, the drain currents for the ON and OFF states are differentiated by a factor of less than 103, exhibiting relatively poor current on/off characteristics.

Figure 6:
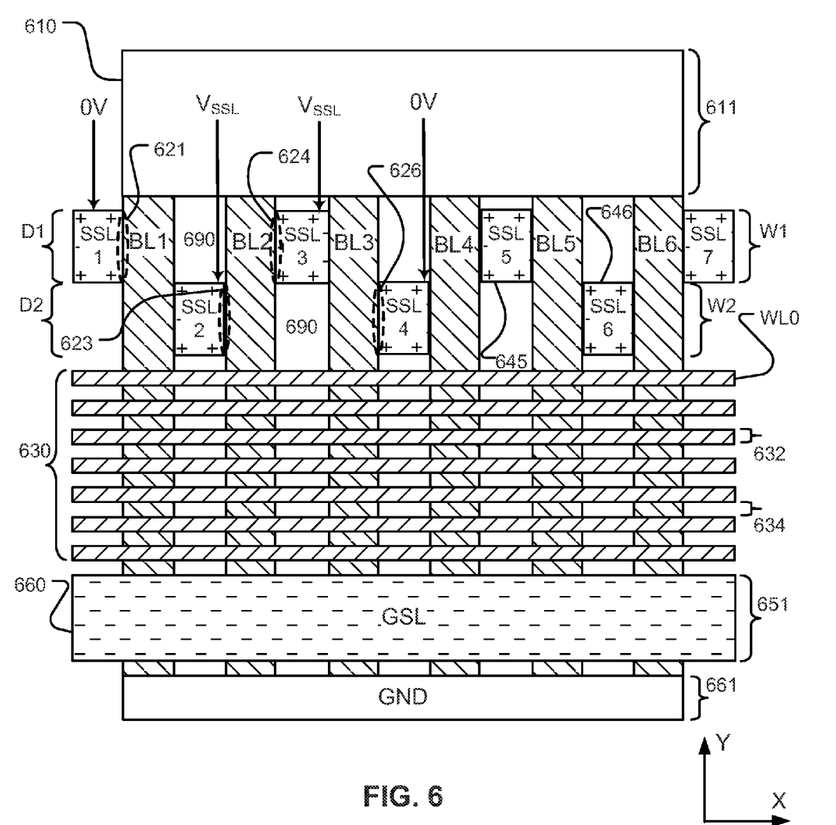
FIG. 6 is an example layout view of an array arrangement for a 3D NAND memory device according to an embodiment of the present technology.

FIG. 6 is an example layout view of an array arrangement for a 3D NAND memory device including twisted string select structures according to an embodiment of the present technology. For reference, the "X" axis lies in the horizontal direction parallel to the word lines (e.g. 125-1 WL through 125-N WL in FIG. 1 or 630 in FIG. 6) in the structure, the "Y" axis lies in the horizontal direction parallel to the active strips (e.g. 112-115 in FIG. 1 or BL1-BL6 in FIG. 6) in the structure, and the "Z" axis lies in the vertical direction orthogonal to the word lines and to the active strips in the structure.

The device includes a plurality of active strips (e.g. BL1-BL6), where active strips in the plurality of active strips are coupled together at one end by a pad (e.g. 610) and terminated at another end by a conductive line (e.g. 660). The device includes a plurality of word lines (e.g. 630), and memory cells at cross-points between the plurality of active strips (e.g. BL1-BL6) and the plurality of word lines (e.g. 630). The device includes a horizontal ground select line GSL overlying the plurality of active strips (e.g. BL1-BL6) between the word lines and the conductive line (e.g. 660). The device includes a plurality of string select structures (e.g. SSL1-SSL7) arranged in an interlaced configuration as side gates for active strips in the plurality of active strips. In contrast to the first array arrangement illustrated in FIG. 2, the plurality of active strips has a same orientation of bit line end-to-source line end. For instance, active strips (e.g. BL1-BL6) in FIG. 6 run in one orientation, from the pad (e.g. 610) at the top to the source line connected to the conductive line (e.g. 660) at the bottom.

The string select structures (e.g. SSL1-SSL7) are configured to act as side gates for channels in the active strips (e.g. BL1-BL6), thereby forming string select switches. The plurality of string select structures is disposed between the pad (e.g. 610) and the plurality of memory cells. The plurality of string select structures include a first subset (e.g. including SSL1, SSL3, SSL5, SSL7) positioned within a first range of distance (e.g. D1) from the pad (e.g. 610) and a second subset (e.g. including SSL2, SSL4, SSL6) positioned within a second range of distance (e.g. D2) from the pad (e.g. 610). The first range is different than the second range. The string select structures have thickness between the active strips sufficient that at least some of the string select structures are configured as the side gates for two adjacent strips (e.g. BL2 and BL3) in the plurality of active strips.

In one embodiment, the first range and the second range can have no overlap with each other along a direction of the active strips (e.g. BL1-BL6). For instance, string select structures SSL5 and SSL6 can be positioned such that a top 646 of the string select structure SSL6 is lower than a bottom 645 of the string select structures SSL5 in a direction along the plurality of active strips.

In an alternative embodiment, the first range and the second range can have a partial overlap with each other along a direction of the active strips. For instance, string select structures SSL5 and SSL6 can be positioned such that the top 646 of the string select structure SSL6 is higher than the bottom 645 of the string select structures SSL5 in a direction along the plurality of active strips.

Active strips (e.g. BL2) in the plurality of active strips are coupled on a first side to a string select structure (e.g. SSL3) in one of the first subset (e.g. including SSL1, SSL3, SSL5, SSL7) and the second subset (e.g. including SSL2, SSL4, SSL6), and are coupled on a second side opposite the first side to a string select structure (e.g. SSL2) in another of the first subset and the second subset. Different string select structures in the plurality of the string select structures are electrically coupled to different pairs in the plurality of active strips. For instance, the string select structure SSL2 is disposed along a pair of active strips BL1 and BL2, while the string select structure SSL3 is disposed along a pair of actives trips BL2 and BL3.

The device includes an insulator 690 that fills between the active strips (e.g. between BL1 and BL2 and between BL2 and BL3) in the plurality of active strips configured so that the insulator 690 is disposed in the first range of distance (e.g. D1) from the pad (e.g. 610) adjacent the second (left) side of the active strips (e.g. BL2) opposite the string select structures (e.g. SSL3) coupled to the first (right) side, and disposed in the second range of distance (e.g. D2) from the pad (e.g. 610) adjacent the first (right) side of the active strips (e.g. BL2) opposite the string select structures (e.g. SSL2) coupled to the second (left) side.

In one embodiment, the pad (e.g. 610) can have a length (e.g. 611) of about 0.5 micrometer (μm). A first subset of the string select structures (e.g. SSL1, SSL3, SSL5, SSL7) can each have a width W1 of about 0.25 m. A second subset of the string select structures (e.g. SSL2, SSL4, SSL6) can each have a width W2 of about 0.25 μm. The width W2 can be the same as or different from the width W1. The widths W1 and W2 are chosen to be sufficient to operate in the way described herein to control current flow in the active strips (e.g. BL1-BL6).

The horizontal word lines (e.g. 630) are interleaved with insulation material (not shown). Each horizontal word line can have a word line thickness (e.g. 632) of about 33 nanometers (nm). Insulation material between two word lines can have an insulation thickness (e.g. 634) of about 33 nm. There can be 66 word lines disposed between the horizontal ground select line GSL and the string select structures (e.g. SSL2, SSL4, SSL6). The horizontal ground select line GSL can have a length (e.g. 651) of about 0.25 μm. The common ground line GND at the bottom can have a size (e.g. 661) of about 0.2 μm.

The plurality of string select structures selects a particular active strip in the plurality of active strips. A combined selection of a particular bit line in a plurality of bit lines, the particular active strip, and a particular word line in the plurality of word lines, identifies a particular memory cell of the 3D array of memory cells. For instance, a combined selection of a particular bit line coupled to the pad 610, a particular active strip BL2 coupled to the string select structures SSL2 and SSL3 and the horizontal ground select line GSL, and a particular word line WL0, identifies a particular memory cell at a cross-point of the particular word line WL0 and the active strip BL2.

The memory device can further include an additional string select structure that has an end position on a side in the plurality of string select structures, such that the additional string select structure is disposed along only one active strip in the plurality of active strips. For instance, an additional string select structure SSL1 has an end position on a left side in the plurality of string select structures, such that the additional string select structure SSL1 is disposed along only one active strip BL1.

The memory device can further include two additional string select structures that have end positions on opposite sides in the plurality of string select structures, such that each of the two additional string select structure is disposed along only one active strip in the plurality of active strips. For instance, two additional string select structures SSL1 and SSL7 have end positions on a left side and a right side in the plurality of string select structures respectively, such that the additional string select structures SSL1 is disposed along only one active strip BL1, and the additional string select structures SSL7 is disposed along only one active strip BL6.

Array efficiency for the 3D NAND memory device illustrated in FIG. 6 is slightly lower than the array efficiency for the 3D NAND memory device illustrated in FIG. 4, because the string select structures in the memory device illustrated in FIG. 6 are disposed in different positions along the plurality of active strips, instead of the same position as in FIG. 4. For instance, the array efficiency for the 3D NAND memory device illustrated in FIG. 6 can be 79.8%, as compared to 83.7% for the 3D NAND memory device illustrated in FIG. 4.

The 3D NAND memory device includes a plurality of planes of memory cells. A plurality of bit lines selects a particular plane in the plurality of planes of memory cells via pads (e.g. 610). The particular plane is decoded by a plurality of string select structures, a horizontal ground select line GSL, and word lines. Voltages can be applied to the plurality of string select structures to select or unselect a particular active strip in the plurality of active strips.

In order to select a particular active strip (e.g. BL2) in the plurality of active strips, a turn-on voltage (e.g. VSSL) is applied to a first string select structure (e.g. SSL3) in the first subset configured as a side gate for the particular active strip on a first side 624, and to a second string select structure (e.g. SSL2) in the second subset configured as a side gate for the particular active strip on a second side 623 opposite the first side 624.

In order to unselect a first adjacent strip and a second adjacent strip adjacent to the selected particular active strip, where the first adjacent strip (e.g. BL1) is coupled to the second string select structure (e.g. SSL2) in the second subset, and the second adjacent strip (e.g. BL3) is coupled to the first string select structure (e.g. SSL3) in the first subset, a turn-off bias is applied to a third string select structure (e.g. SSL1) in the first subset configured as a side gate for the first adjacent strip (e.g. BL1), and to a fourth string select structure (e.g. SSL4) in the second subset configured as a side gate for the second adjacent strip (e.g. BL3). The turn-off bias includes one of a ground voltage, a non-negative voltage, and a floating condition (high impedance state or disconnected state) applied to the third and fourth string select structures. Although a negative turn-off bias can also work with the present technology, the present technology makes it possible to implement the SSL structures without using negative voltage, such as −7V to unselect active strips adjacent to a selected active strip, as required by the second array arrangement for a 3D NAND memory device as described in connection with FIG. 4.

Thus, in contrast to the second array arrangement for a 3D NAND memory device as described in connection with FIG. 4, to unselect adjacent active strips (e.g. BL1, BL3) adjacent to a selected active strip (e.g. BL2), a negative turn-off voltage is not required on corresponding adjacent string select structures (e.g. SSL1 and SSL4) coupled to side gates at opposite sides (e.g. 621, 626) of the adjacent active strips (e.g. BL1, BL3). To unselect active strips, a voltage of about 0 volt can be applied to the string select structures (e.g. SSL1, SSL4-7) coupled to the active strips to be unselected (e.g. BL1, BL3-6), regardless of whether the active strips to be unselected are adjacent to a selected active strip (e.g. BL2).

The plurality of active strips (e.g. BL1-BL6) and the pad (e.g. 610) are disposed in a layer of a multilayer structure including a plurality of layers that comprise respective pluralities of active strips and pads, and wherein string select structures (e.g. SSL1-SSL7) in the plurality of string select structures are extended through the plurality of layers between the corresponding pluralities of active strips, and are disposed as side gates for active strips in the plurality of layers.

Figure 7A:
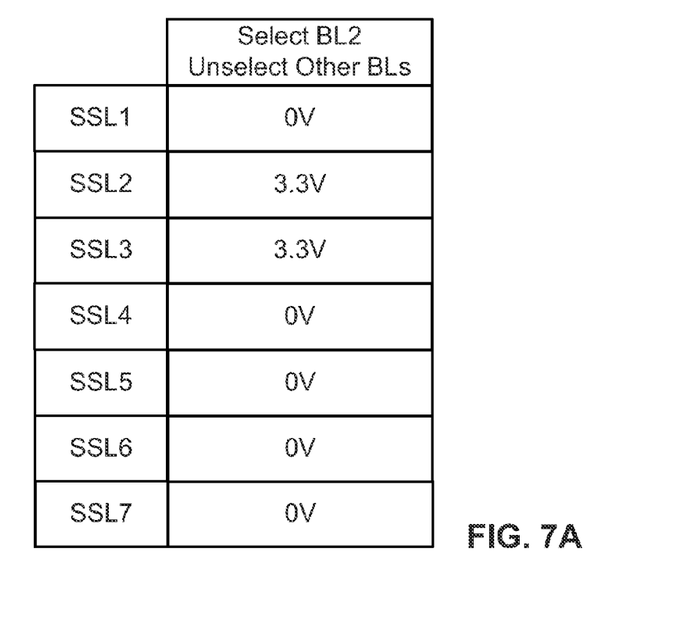
FIG. 7A is a table illustrating voltages on twisted string select structures as shown in FIG. 6.

FIG. 7A is a table illustrating voltages on twisted string select structures as shown in FIG. 6, for selecting a particular active strip. In the example shown in FIG. 7A, a value for a turn-on voltage (VSSL) on opposite sides (e.g. 623, 624) of a selected active strip (e.g. BL2) is 3.3V. To unselect other active strips (e.g. BL1, BL3-6), regardless of whether the other active strips are adjacent to the selected active strip (e.g. BL2), a turn-off bias is applied to the corresponding string select structures (e.g. SSL1, SSL4-7). The turn-off bias includes one of a ground voltage, a non-negative voltage, and a floating condition. Although a negative turn-off bias can also work with the present technology, the present technology makes it possible to implement the SSL structures without using negative voltage, such as −7V to unselect active strips adjacent to a selected active strip, as required by the second array arrangement for a 3D NAND memory device as described in connection with FIG. 4.

Figure 7B:
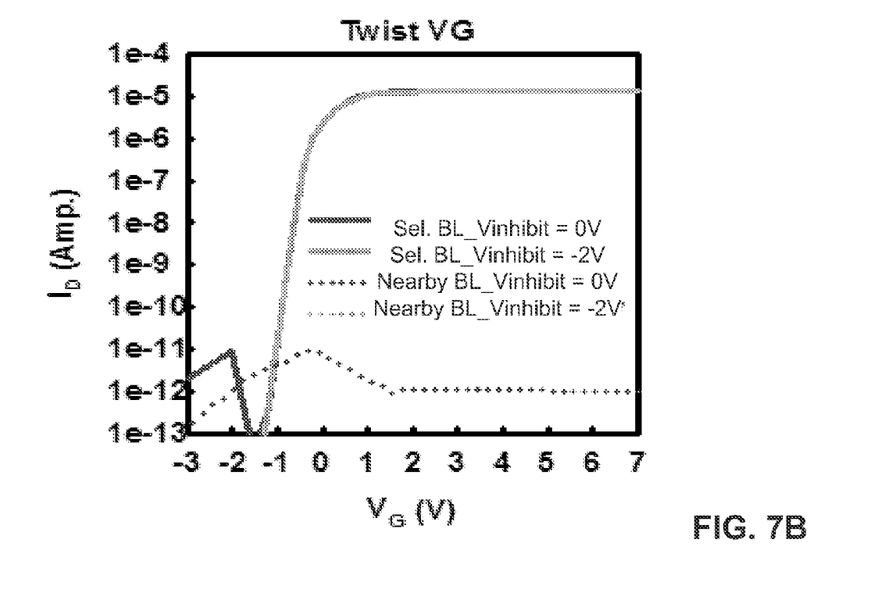
FIG. 7B illustrates current-voltage characteristics for twisted string select structures as shown in FIG. 6.

FIG. 7B illustrates current-voltage characteristics for twisted string select structures as shown in FIG. 6. As illustrated in FIG. 7B, with a turn-off voltage (Vinhibit) at about 0V or −2V, the drain current for a selected twisted string select structure in an ON state can reach 1e-5 ampere with gate voltage VG above about 1V, and the drain current for unselected twisted string select structures in an OFF state adjacent to (nearby) the selected twisted string select structure can be below about 1e-11 ampere. Thus, the drain currents for the ON state and the OFF state are differentiated by a factor of about 10⁶, providing better on/off characteristics than the on/off characteristics illustrated in FIG. 5B for the second array arrangement including string select structures.

Figure 8:
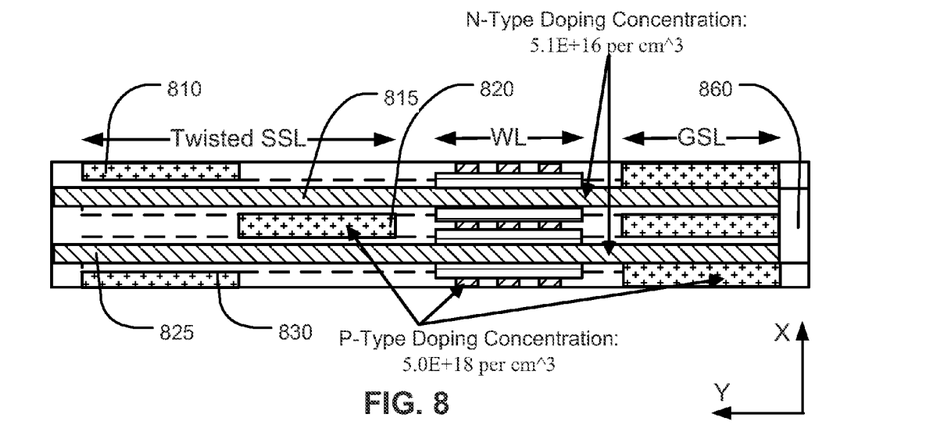
FIG. 8 illustrates simulation results of doping concentration for the array arrangement for a 3D NAND memory device as shown in FIG. 6.

FIG. 8 illustrates simulation results of doping concentration for the array arrangement of a 3D NAND memory device including twisted string select structures as shown in FIG. 6. As illustrated in FIG. 8, adjacent string select structures (e.g. 810, 820 and 830) in the plurality of string select structures as described herein are disposed in different positions along the plurality of active strips (e.g. 815 and 825), connected to a common ground line (e.g. 860).

As illustrated in FIG. 8, active strips (e.g. 815, 825) have an n-type doping concentration of about 5.1E+16 per cm^3. Twisted string select structures (e.g. 810, 820 and 830), word lines WL, and ground select lines GSL are coupled to the active strips and have a p-type doping concentration of about 5.0E+18 per cm^3.

Figure 9:
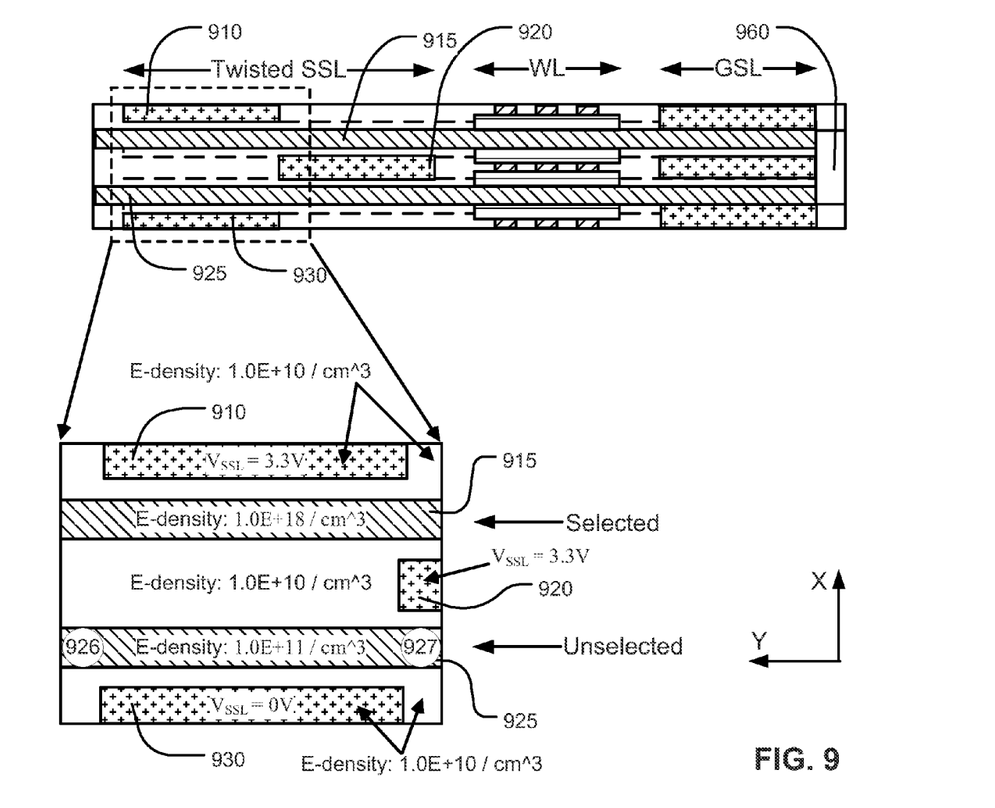
FIG. 9 illustrates simulation results of e-density profile for the array arrangement for a 3D NAND memory device as shown in FIG. 6.

FIG. 9 illustrates simulation results of e-density profile for the array arrangement for a 3D NAND memory device including twisted string select structures as shown in FIG. 6. As illustrated in FIG. 9, adjacent string select structures (e.g. 910, 920 and 930) in the plurality of string select structures as described herein are disposed in different positions along the plurality of active strips (e.g. 915 and 925), connected to a common ground line (e.g. 960). The active strip 915 is selected with a turn-on voltage (VSSL) of 3.3V on the string select structures 910 and 920 disposed in different positions along the active strip 915. The active strip 925 is unselected with a turn-off voltage of 0V on the string select structure 930 disposed along one side of the active strip 925.

As illustrated in FIG. 9, active strip in the selected active strip (e.g. 915) has an e-density of about 1.0E+18 per cm^3, while a portion of the active strip in the unselected active strip (e.g. 925) has an e-density of about 1.0E+11 per cm^3 along the string select structure 930. At both ends of the portion (e.g. 926 and 927), e-density can be about 1.0E+18 per cm^3. Thus, the e-density in the selected active strip is about 1.0E+7 times higher than in the portion of the unselected active strip (e.g. 925) along the string select structure 930.

Figure 10:
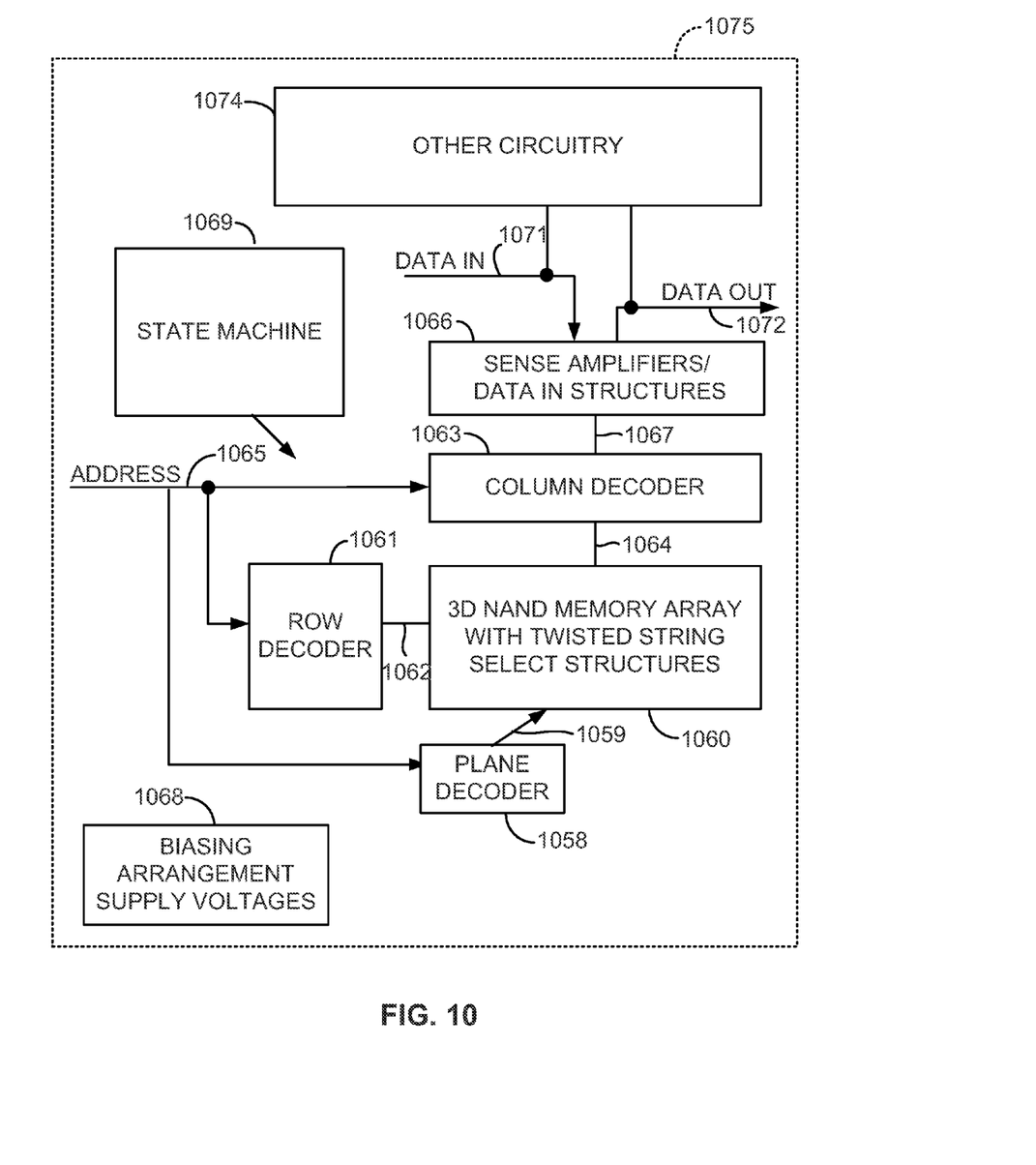
FIG. 10 is a schematic diagram of an integrated circuit including a 3D NAND memory array with twisted string select structures.

FIG. 10 is a schematic diagram of semiconductor device including a 3D NAND memory array with twisted string select structures according to an embodiment of the present technology. The semiconductor device 1075 includes a 3D NAND flash memory array 1060, implemented as described herein, on a semiconductor substrate with twisted string select structures disposed in different positions along a plurality of active strips of NAND strings of memory cells. A row decoder 1061 is coupled to a plurality of word lines 1062, and arranged along rows in the memory array 1060. A column decoder 1063 is coupled to a plurality of SSL lines 1064, including twisted string select structures, arranged along columns corresponding to active strips in the memory array 1060 for reading and programming data from the memory cells in the array 1060. A plane decoder 1058 is coupled to a plurality of planes in the memory array 1060 via bit lines 1059. Addresses are supplied on bus 1065 to column decoder 1063, row decoder 1061 and plane decoder 1058. Sense amplifiers and data-in structures in block 1066 are coupled to the column decoder 1063 in this example via data bus 1067. Data is supplied via the data-in line 1071 from input/output ports on the integrated circuit 1075 or from other data sources internal or external to the integrated circuit 1075, to the data-in structures in block 1066. In the illustrated embodiment, other circuitry 1074 is included on the integrated circuit, such as a general purpose processor or special purpose application circuitry, or a combination of modules providing system-on-a-chip functionality supported by the NAND flash memory cell array. Data is supplied via the data-out line 1072 from the sense amplifiers in block 1066 to input/output ports on the integrated circuit 1075, or to other data destinations internal or external to the integrated circuit 1075.

A controller implemented in this example using bias arrangement state machine 1069 controls the application of bias arrangement supply voltage generated or provided through the voltage supply or supplies in block 1068, such as read, erase, program, erase verify and program verify voltages.

In order to select a particular active strip in the plurality of active strips, the controller can apply a turn-on voltage to two string select structures both of which are arranged as side gates for the particular active strip.

In order to unselect a second particular active strip in the plurality of active strips, the controller can apply a turn-off voltage to at least one string select structure arranged as a side gate for the second particular active strip. The turn-off bias includes one of a ground voltage, a non-negative voltage, and a floating condition.

The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the technology and the scope of the following claims.

What is claimed is:

1. A semiconductor device, comprising:
   a plurality of active strips, wherein all of the active strips in the plurality are coupled together at one end by a pad and terminated at another end by a conductive line;
   a plurality of word lines;
   memory cells at cross-points between the plurality of active strips and the plurality of word lines; and
   a plurality of side gates disposed on the sides of active strips in the plurality of active strips between the pad and the memory cells, and configured to act as side gates for string select transistors having channels in the active strips,
   wherein the plurality of side gates include first and second side gates on opposite sides of a particular active strip in the plurality of active strips; and
   control circuitry coupled to the plurality of side gates, including circuits to apply a turn-on voltage to the first side gate and to apply a turn-off bias to the second side gate at a same time, the first and second side gates on opposite sides of the particular active strip.

2. The device of claim 1, wherein the plurality of side gates include a first subset positioned within a first range of distance from the pad and a second subset positioned within a second range of distance from the pad, the first range being different than the second range, and wherein the first side gate is a member of the first subset and the second side gate is a member of the second subset.

3. The device of claim 2, wherein active strips in the plurality are coupled on a first side to a side gate in one of the first subset and the second subset, and are coupled on a second side opposite the first side to a side gate in another of the first subset and the second subset.

4. The device of claim 3, including an insulator that fills between the active strips in the plurality configured so that the insulator is disposed in the first range of distance from the pad adjacent the second side of the active strips opposite the side gates coupled to the first side, and disposed in the second range of distance from the pad adjacent the first side of the active strips opposite the side gates coupled to the second side.

5. The device of claim 2, wherein the first range and the second range have no overlap.

6. The device of claim 2, wherein the first range and the second range have a partial overlap.

7. The device of claim 2, in order to select the particular active strip in the plurality, the control circuitry applies the turn-on voltage to the first side gate in the first subset configured as a side gate for the particular active strip, and to the second side gate in the second subset configured as a side gate for the particular active strip.

8. The device of claim 7, in order to unselect a first adjacent strip and a second adjacent strip adjacent to the particular active strip, wherein the first adjacent strip is coupled to the second side gate in the second subset, and the second adjacent strip is coupled to the first side gate in the first subset, the control circuitry applies the turn-off bias to a third side gate in the first subset configured as a side gate for the first adjacent strip, and to a fourth side gate in the second subset configured as a side gate for the second adjacent strip.

9. The device of claim 8, wherein the turn-off bias includes one of a ground voltage, a non-negative voltage, and a floating condition applied to the third and fourth side gates.

10. The device of claim 1, wherein side gates in the plurality are configured as the side gates for two adjacent active strips in the plurality of active strips.

11. The device of claim 1, wherein the control circuitry includes circuits to apply voltages to the plurality of side gates including voltages on the first and second side gates to select the particular active strip in the plurality of active strips.

12. The device of claim 11, wherein a combined selection of a particular bit line in a plurality of bit lines, the particular active strip, and a particular word line in the plurality, identifies a particular memory cell of the memory cells.

13. The device of claim 1, wherein a particular side gate in the plurality controls conductivity in a first active strip and a second active strip in the plurality.

14. The device of claim 1, wherein the plurality of active strips and said pad are disposed in a layer of a multilayer structure including a plurality of layers that comprise respective pluralities of active strips and pads, and wherein side gates in said plurality of side gates are extended through the plurality of layers between the corresponding pluralities of active strips, and are disposed as side gates for active strips in said plurality of layers.

15. A method of manufacturing a semiconductor device, comprising:
   providing a plurality of active strips, wherein all of active strips in the plurality are coupled together at one end by a pad and terminated at another end by a conductive line, a plurality of word lines, memory cells at crosspoints between the plurality of active strips and the plurality of word lines, and a plurality of side gates disposed on the sides of active strips in the plurality of active strips between the pad and the memory cells, and configured to act as side gates for string select transistors having channels in the active strips, wherein the plurality of side gates include first and second side gates on opposite sides of a particular active strip in the plurality of active strips; and
   providing control circuitry coupled to the plurality of side gates, including circuits to apply a turn-on voltage to the first side gate and to apply a turn-off bias to the second side gate at a same time, the first and second side gates on opposite sides of the particular active strip, wherein the control circuitry applies non-zero, on-state voltages to two of the plurality of side gates, both of which are adjacent a selected string, and applies off-state voltages to remaining side gates in the plurality to block current flow in other strings.

16. The method of claim 15, wherein the plurality of side gates include a first subset positioned within a first range of distance from the pad and a second subset positioned within a second range of distance from the pad, the first range being different than the second range, and wherein the first side gate is a member of the first subset and the second side gate is a member of the second subset.

17. The method of claim 16, wherein active strips in the plurality are coupled on a first side to a side gate in one of the first subset and the second subset, and are coupled on a second side opposite the first side to a side gate in another of the first subset and the second subset.

18. The method of claim 17, the semiconductor device including an insulator that fills between the active strips in the plurality configured so that the insulator is disposed in the first range of distance from the pad adjacent the second side of the active strips opposite the side gates coupled to the first side, and disposed in the second range of distance from the pad adjacent the first side of the active strips opposite the side gates coupled to the second side.

19. The method of claim 16, in order to select the particular active strip in the plurality, the control circuitry applies the turn-on voltage to the first side gate in the first subset configured as a side gate for the particular active strip, and to the second side gate in the second subset configured as a side gate for the particular active strip.

20. The method of claim 19, in order to unselect a first adjacent strip and a second adjacent strip adjacent to the particular active strip, wherein the first adjacent strip is coupled to the second side gate in the second subset, and the second adjacent strip is coupled to the first side gate in the first subset, the control circuitry applies the turn-off bias to a third side gate in the first subset configured as a side gate for the first adjacent strip, and to a fourth side gate in the second subset configured as a side gate for the second adjacent strip.

21. The method of claim 15, wherein side gates in the plurality are configured as the side gates for two adjacent active strips in the plurality of active strips.

22. The method of claim 15, wherein the control circuitry includes circuits to apply voltages to the plurality side gates including voltages on the first and second side gates to select the particular active strip in the plurality of active strips.

23. The method of claim 15, wherein the plurality of active strips and said pad are disposed in a layer of a multilayer structure including a plurality of layers that comprise respective pluralities of active strips and pads, and wherein side gates in said plurality of side gates are extended through the plurality of layers between the corresponding pluralities of active strips, and are disposed as side gates for active strips in said plurality of layers.

* * * * *